United States Patent [19]

Hayakawa et al.

[11] Patent Number: 5,685,968

[45] Date of Patent: Nov. 11, 1997

[54] CERAMIC SUBSTRATE WITH THIN-FILM CAPACITOR AND METHOD OF PRODUCING THE SAME

[75] Inventors: Toshitaka Hayakawa; Shinobu Yoshida; Toshikatsu Takada, all of Nagoya, Japan

[73] Assignee: NGK Spark Plug Co., Ltd., Nagoya, Japan

[21] Appl. No.: 540,969

[22] Filed: Oct. 11, 1995

[30] Foreign Application Priority Data

Oct. 14, 1994 [JP] Japan .................................. 6-275991

[51] Int. Cl.⁶ .......................... C25D 5/02; C25D 5/54; C25D 5/10; H01G 4/10
[52] U.S. Cl. ...................... 205/122; 205/124; 205/162; 205/171; 205/176; 205/181; 205/182; 205/184; 205/186; 205/199; 29/25.42; 361/322; 427/79
[58] Field of Search ............................ 205/122, 124, 205/162, 171, 176, 181, 182, 184, 186, 199; 29/25.42; 361/322; 427/79, 304, 305, 437, 438

[56] References Cited

U.S. PATENT DOCUMENTS

| | | | |
|---|---|---|---|
| 2,993,266 | 7/1961 | Berry | 205/122 |
| 3,607,679 | 9/1971 | Melroy et al. | 205/122 |
| 3,721,870 | 3/1973 | Edge | 317/258 |
| 3,869,367 | 3/1975 | Sato et al. | 204/192 |
| 4,002,545 | 1/1977 | Fehiner et al. | 29/25.42 |

FOREIGN PATENT DOCUMENTS

| | | |
|---|---|---|
| 49-88076 | 8/1974 | Japan . |
| 52-53257 | 4/1977 | Japan . |
| 59-35167 | 8/1984 | Japan . |
| 4-302117 | 10/1992 | Japan . |
| 788763 | 1/1958 | United Kingdom . |

OTHER PUBLICATIONS

"Electrical Communication Laboratories Technical Journal", vol. 23, No. 2, pp. 267–285, published by the Electrical Communication Laboratories of Nippon Telegraph and Telephone Public Corp. (1974) (no month).

Primary Examiner—Kathryn L. Gorgos
Assistant Examiner—Edna Wong
Attorney, Agent, or Firm—Foley & Lardner

[57] ABSTRACT

In a ceramic substrate with a thin-film capacitor, having a ceramic substrate a lower electrode layer formed on the ceramic substrate, a dielectric layer formed on the lower electrode layer and made of an oxide of a material constituting the lower electrode layer, and an upper electrode layer formed on the dielectric layer, a plating layer is provided between the ceramic base and the lower electrode layer to serve as a basis for the lower electrode layer.

20 Claims, 6 Drawing Sheets

CERAMIC SUBSTRATE WITH THIN-FILM CAPACITOR AND METHOD OF PRODUCING THE SAME

BACKGROUND OF THE INVENTION

1. Field of the Invention

The present invention relates to a ceramic substrate with a thin-film capacitor, i.e., a ceramic substrate on which a thin-film capacitor is formed, and more specifically of such a kind that can actually lower the resistance of a lower electrode layer and thereby can be inexpensive, excellent in the high frequency characteristic and highly reliable in operation. Further, the present invention relates to a method of producing such a kind of ceramic substrate with a thin-film capacitor.

2. Description of the Prior Art

By recent development of the semiconductor technology, a high speed operation (high frequency drive) of a computer has come to be practiced, and it has been sought for a measure to enable a ceramic substrate for use in such a computer to cope with a tendency to high frequency. Particularly, since a high speed operation of a semiconductor element is liable to cause noise, it has been practiced to form a capacitor on a substrate in order to pursue a method forming a capacitor just adjacent the semiconductor element.

As an example of such a method, a method of forming a thin-film capacitor on a substrate is known together with a method of installing a chip capacitor on a substrate, a method of forming a capacitor inside a substrate by co-firing, etc.

The method of forming a thin-film capacitor on a substrate is generally such one as follows, as described in Japanese patent provisional publication No. 52-53257.

A thin-film layer of Ta, Ti, Al or the like is formed on a substrate by sputtering or vapor deposition, and thereafter a part of the thin-film layer of, for example, Ta is oxidized to an oxide, i.e., $Ta_2O_5$ by an anode forming process to constitute a dielectric layer. Thereupon, an upper electrode layer of Au or the like is formed by vapor deposition or the like for thereby forming a thin-film capacitor of the kind in which Ta is used for the lower electrode layer and an oxide of Ta is used for the dielectric layer. Such a capacitor possesses a high capacitance due to the fact that the dielectric layer is so thin, i.e., 0.05–several μm thick, and accordingly a desired capacitance can be obtained by a relative small area.

However, such a capacitor is liable to be influenced by the surface irregularities since the lower electrode layer and the dielectric layer are so thin, and there is a possibility that the dielectric layer has a locally thinner part to cause dielectric breakdown, leading to a lack of reliability.

Thus, as described in "Electrical Communication Laboratories Technical Journal", Vol. 23, No. 2, pages from 267 to 285, published by the Electrical Communication Laboratories of Nippon Telegraph and Telephone Public Corporation, in 1974, a substrate having a smooth surface such as a glass substrate or a glazed ceramic substrate is used for a basis for such a capacitor, and it is reported at page 275 of the above journal that the surface roughness must be equal to or small than 0.1 μm.

However, the glass substrate is lower in the strength as compared with a general alumina ceramic substrate and more expensive. Further, in the glazed ceramic substrate obtained by forming a glass layer on a ceramic substrate, an alumina substrate is generally used for the ceramic substrate, so the strength obtained is sufficient but as compared with an alumina substrate which is not treated by a glazing process, it requires a longer process due to the necessity of the glazing process and thus more expensive. Further, depending on the glazing pattern, the available shape of the capacitor is restricted, so the design freedom of the substrate is lowered.

Further, as described before, an oxide of Ta, Ti, Al or the like is generally used as dielectric. However, there is another method as described in Japanese patent provisional publication No. 59-35167. By such a method, a thin-film of tantalum nitride (TAN, $Ta_2N$, etc.) is formed on a substrate to serve as a resistor and a part of tantalum nitride is oxidized by an anode forming process to form tantalum oxynitride (Ta—ON), etc. and used as dielectric.

However, by such a method of forming dielectric, a thin-film of Ta, TaN or the like is directly formed on the substrate and is finally used as a lower electrode layer, so the resistance of the lower electrode layer is high and accordingly a problem concerning the high frequency characteristics of the capacitor is caused.

SUMMARY OF THE INVENTION

According to an aspect of the present invention, there is provided a ceramic substrate with a thin-film capacitor, which comprises a ceramic substrate, a lower electrode base layer which is a metallic electroplating or electroless plating layer, formed on the ceramic substrate, a lower electrode layer formed on the lower electrode base layer, a dielectric layer formed on the lower electrode layer and made of an oxide of a material constituting the lower electrode layer, and an upper electrode layer formed on the dielectric layer.

According to another aspect of the present invention, the lower electrode base layer is made of a material mainly containing copper.

According to a further aspect of the present invention, the lower electrode base layer is made of a material mainly containing nickel.

According to a further aspect of the present invention, the lower electrode base layer includes a layer section made of a material mainly containing copper and a layer section made of a material mainly containing nickel.

According to a further aspect of the present invention, the lower electrode layer is made of one or more of metals selected from a group consisting of tantalum, titanium and aluminum.

According to a further aspect of the present invention, the lower electrode layer is made of tantalum nitride and the dielectric layer is made of tantalum oxynitride.

According to a further aspect of the present invention, there is provided a method of producing a ceramic substrate with a thin-film capacitor, which comprises the steps of forming by metallic electroplating or electroless plating a lower electrode base layer on a ceramic substrate, forming a thin-film on the lower electrode base layer, processing a surface portion of the thin-film by an oxidizing process and thereby forming a dielectric layer whilst allowing a remaining portion of the thin-film to be formed into a lower electrode layer, and forming an upper electrode layer on the dielectric layer.

According to a further aspect of the present invention, the metallic plating is copper plating.

According to a further aspect of the present invention, the metallic plating is nickel plating.

According to a further aspect of the present invention, the metallic plating includes copper plating, and nickel plating performed thereafter.

According to a further aspect of the present invention, the oxidizing process is an anode forming process.

In a ceramic substrate with a thin-film capacitor, the thin-film for a lower electrode layer and a dielectric layer is generally formed by sputtering, CVD (chemical vapor deposition), vacuum vapor deposition, ion plating, LB (Langmuir-Blodgett) film method or the like thin-film forming technique. The thin-film is so thin, for example, in case of a thin-film which is formed from Ta by sputtering, it is in many cases formed so as to be about 0.1–0.3 μm (1000–3000 Å) thick. For example, when about a 0.05 μm thick portion of a 0.1 μm thick Ta thin-film is left undone the surface portion is treated by an anode forming process in 0.1% citric acid solutions and oxidized to $Ta_2O_5$, the thickness is increased to be about three to five times due to oxidation. Accordingly, an about 0.05 μm (500 Å) thick lower electrode layer made of Ta and an about 0.15–0.25 μm (1500–2500 Å) thick dielectric layer made of $Ta_2O_5$ are formed.

The lower electrode layer made of Ta is thin and moreover Ta has a large resistivity, so its resistance is high. Accordingly, a thin-film capacitor having such a structure has a disadvantage that its high frequency characteristics are deteriorated. That is, assuming that f is frequency, ω is angular frequency and ω=2πf, C is capacitance, R is resistance, and inductance is ignored, the loss factor (tan δ) of the capacitor is determined by the following formula: tan δ=ω CR. Accordingly, the higher the frequency becomes and the higher the resistance becomes, the larger the loss factor becomes.

To solve this problem, it is considered to make thicker the thin-film which is formed by sputtering or the like and thereby lower the resistance of the lower electrode layer. In principle, it is possible to increase the thickness of the thin-film up to about several μm by sputtering or the like thin-film forming technique. However, this method is impractical and cannot be employed in industrial manufacture since the processing by the method takes much time and thus the cost becomes considerably high. Furthermore, the process of sputtering or the like naturally requires an expensive device and lacks in mass productivity, so it is still more impossible to lower the cost. Further, as described in page 271 of the above noted report, sputtering has a disadvantage that it causes heat generation of a substrate, deterioration of the accuracy of etching for forming a pattern, etc.

It is considered, as another method, to form a precious metal or the like metal having a high conductivity by sputtering or the like technique as a basis for the lower electrode layer. However, this method is the same as the previous method and requires much cost for increasing the thickness and lacks in mass productivity.

However, according to the present invention, the lower electrode base layer is formed by electroplating or electroless plating, so the lower electrode base layer of the thickness of about several tens μm can be formed without much difficulty and in a short time. Accordingly, although the resistance of the lower electrode layer made of Ta or the like, it becomes possible, by the effect of the lower electrode base layer formed by electroplating or electroless plating, to lower the resistance as a whole considerably, and a lower electrode layer which is actually lower in resistance can be formed.

Particularly, it is convenient to use a metal, which mainly contains Ni or Cu, for the lower electrode base layer which is formed by plating. Since Ni electroplating is a plating method which is usually used in the process for manufacturing a ceramic substrate for forming a basis plating of a pin or the like input/output terminal, bonding pad, etc., the devices for carrying out this process can be made use of, and even if independent devices are necessitated for the plating method, any particularly expensive device is not necessary. Furthermore, since the electroplating or electroless plating is inexpensive and hard to oxidize so as to be stable in a surface condition, it has an advantage of being suited for mass production. Further, by the use of Cu, the cost can be low similarly to Ni, and by the effect of the low resistivity of Cu the electrode resistance can be further lower than that in case of Ni. In the meantime, for the electroplating or electroless plating layer, it is better to use Ni plating added with Co (cobalt), P (phosphorus), B (boron), or the like than pure Ni plating since the strength of the plating film, mass productivity, etc. are improved whilst the electroplating or electroless plating process becomes stable and its control is easy.

Further, in order to improve the smoothness of the plating surface, it is better to add a surface smoothing agent (cover cream) or the like into plating solutions.

Further, by forming the lower electrode base layer by electroplating or electroless plating, the surface of the lower electrode base layer can be smoothed and flattened by the levelling characteristic of plating. That is, by growing of the plating in such a manner as to fill up the irregularities and the pores (voids), flaws or the like surface defects in the surface of the substrate, the surface of the lower electrode base layer becomes flatter and smoother than the surface of the substrate. Accordingly, by not using a glazed ceramic substrate but a usual ceramic substrate which is not glazed, it never occurs that the dielectric layer becomes partially or locally thinner by the influence of the surface defect of the substrate. That is, it becomes possible to improve the dielectric breakdown voltage and make the capacitor be highly reliable, and furthermore it becomes possible to use a ceramic substrate which is not glazed and therefore inexpensive.

The thickness of the lower electrode base layer (plating layer) is calculated from the resistance necessitated by the required characteristic of the capacitor and the material of the lower electrode layer, etc. and is determined on consideration of the smoothness of the surface of the substrate. However, in order to lower the resistance, it is considered to be usual that the thickness equal to that of the lower electrode layer or so, i.e., the thickness of 1 μm or more is required.

Among metals, Ta, Ti, Al, etc. are suitable for forming the thin-film as described above. This is because an oxide can be formed easily by an anode forming process and moreover its dielectric constant is relatively high.

Further, tantalum nitride (TAN, $Ta_2N$, etc.) can be used for the thin-film. Since the tantalum nitride can be used as a resistor, it is convenient particularly in case a resistor is formed on the substrate in addition to the capacitor. In the portion where a capacitor is constituted, its surface is oxidized to form tantalum oxynitride (Ta—ON) and is used as a dielectric layer, whilst tantalum nitride can be used as a lower electrode base layer and therefore the capacitor and the resistor can be formed on the substrate at the same time.

In this instance, the lower electrode layer becomes high in resistance, which will be considered inconvenient. However, since the lower electrode base layer is actually low in resistance and the entire resistance is determined almost by the resistance of the lower electrode base layer, the resistance of the lower electrode layer affects nothing and such an inconvenience is not caused.

DETAILED DESCRIPTION OF THE PREFERRED EMBODIMENT

Referring to FIGS. 1 to 8, a ceramic substrate with a thin-film capacitor according to an embodiment of the present invention will be described. The embodiment is of the kind where a capacitor and a resistor are formed at the same time.

Figure 1:
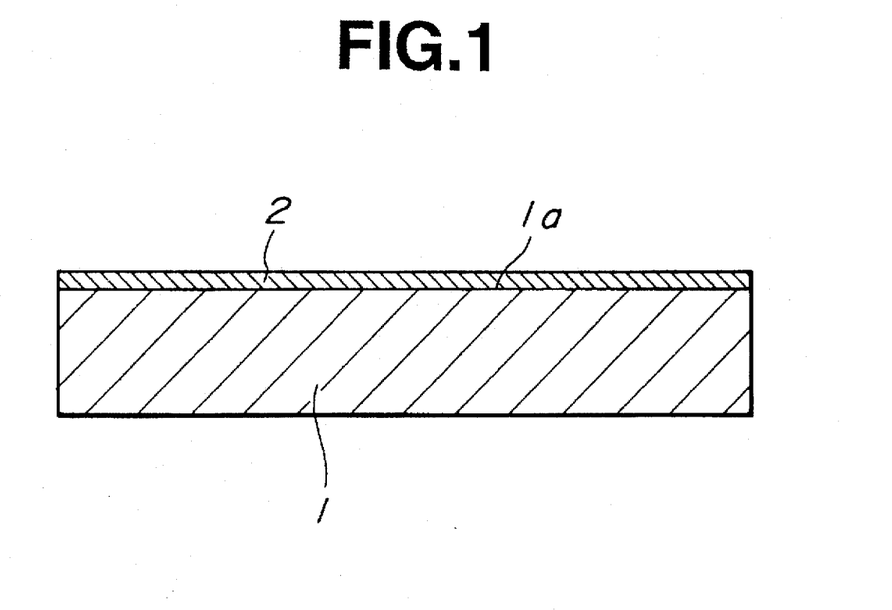
FIG. 1 is a sectional view for illustration of a process of forming a ceramic substrate with a thin-film capacitor according to the present invention and illustrates a step of forming a connecting layer 2 on the surface 1a of a ceramic substrate 1.

As shown in FIG. 1, a ceramic substrate 1, which is made of 92% alumina and 50×50 mm, is prepared and its surface 1a is ground to have a surface roughness Ra=0.5 μm.

Then, on the entire surface 1a, a connecting layer 2 of Ti (0.2 μm) and Cu (0.5 μm) is formed by sputtering. This layer is provided for the purpose of giving to the ceramic substrate 1 a conductivity that enables electroplating and firmly bonding the ceramic substrate and a metallic layer (in this embodiment, a lower electrode base layer) to be formed thereon.

Figure 2:
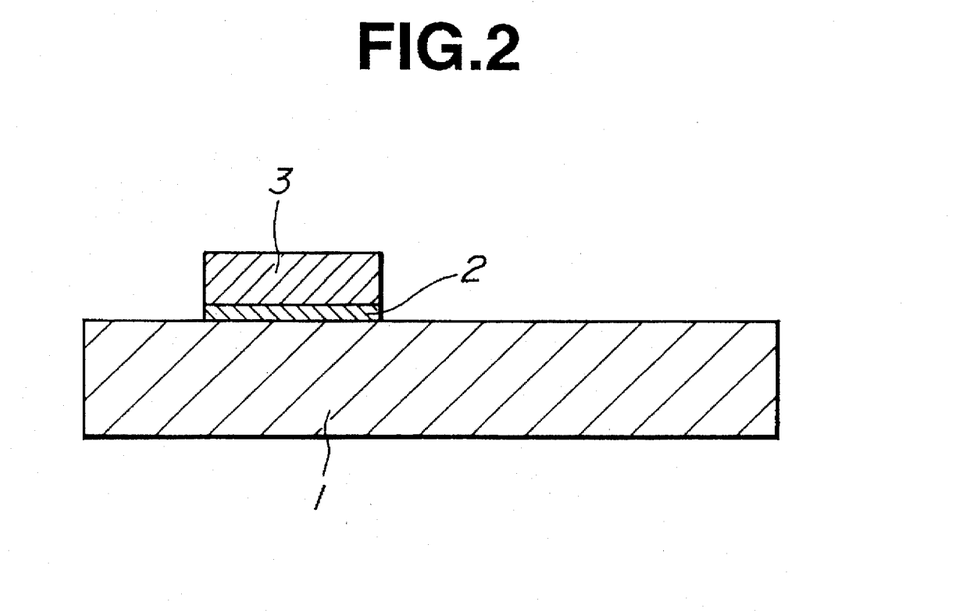
FIG. 2 is a view similar to FIG. 1 but illustrates a further step of forming a lower electrode base layer 3 on the ceramic substrate 1 by way of the connecting layer 2.

Then, a photoresist (not shown) is applied to form a desired pattern (in this embodiment, 1 mm square), thereafter a lower electrode base layer 3 of Cu (10 μm) and Ni (1 μm) are formed by electroplating, and the photoresist and an exposed portion of the connecting layer 2 are removed (refer to FIG. 2). In this instance, the Cu plating solutions contain Cu as a principal component and are added with 0.5% CUREX S (trade name of an additive for smoothing a plating surface, made by ELECTROPLATING ENGINEERS OF JAPAN LTD.). Further, the Ni electroplating is performed by using Ni—Co plating solutions that contain Ni as a principal component and 20–40% Co but are not added with an additive for smoothing a plating surface.

Upon this time, the lower electrode base layer 3 grows in such a manner as to fill up pores or the like surface defects, so the surface of the base layer 3 is formed flat (Ra=about 0.1–0.3 μm) without being affected so much by the surface defect of the ceramic substrate 1.

Figure 3:
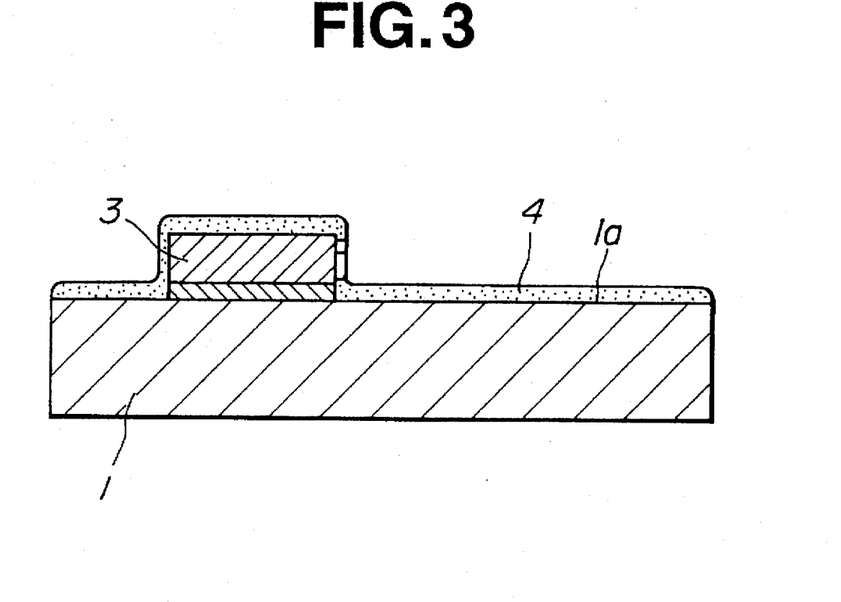
FIG. 3 is a view similar to FIG. 2 but illustrates a further step of forming a thin-film layer 4 on the surface of the ceramic substrate 1 and the lower electrode base layer 3.

Further, as shown in FIG. 3, on the entire exposed portions of the substrate surface 1a and the surface of the base layer 3, a 0.15 μm thick thin-film 4 of $Ta_2N$ is formed by sputtering. In this instance, since the surface of the base layer 3 is flat, a surface irregularity such as being partially or locally thinner can never occur in the thin-film 4 formed on the base layer 3.

Figure 4:
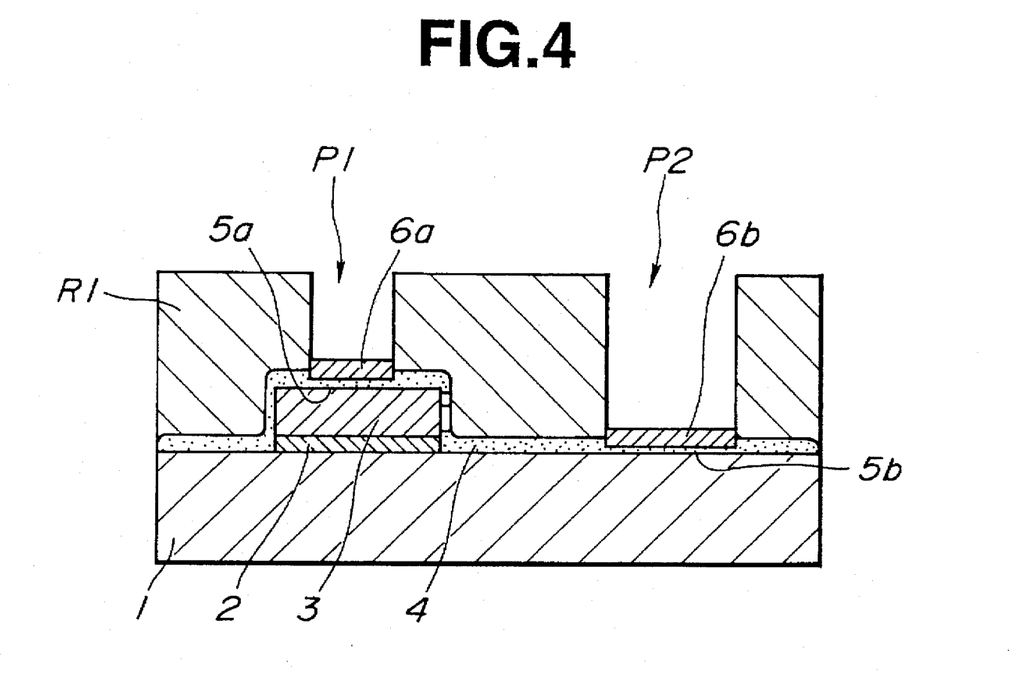
FIG. 4 is a view similar to FIG. 3 but illustrates a further step of forming photoresists R1 and openings P1 and P2, and treating the thin-film layer 4 by an anode forming process.

Then, as shown in FIG. 4, a photoresist R1 is applied and a predetermined pattern is exposed so that only a 0.7×0.7 mm opening P1 on the base layer 3 and a 0.2×0.2 mm opening P2 on the ceramic substrate surface 1a are formed.

Thereafter, an anode forming process is performed in citric acid solutions in a known manner, whereby the portions of the thin-film layer 4, which are located within the openings P1 and P2 and 0.1 μm deep from the surface, are anodic oxidized and formed into a 0.3–0.5 μm thick Ta—ON dielectric layer 6a and anodic oxidize layer 6b. In this connection, increase in the thickness of the dielectric layer 6a, etc. is caused by the phenomenon that $Ta_2N$ is converted into Ta—ON by the above oxidizing process. Accordingly, as shown in FIG. 4, a 0.05 μm thick lower electrode layer 5a and a 0.3–0.5 μm thick dielectric layer 6a are formed. In the meantime, while the lower electrode layer 5a is 0.05 μm thick in the place under the dielectric layer 6a, it is equal in thickness to the thin-film 4, i.e., 0.15 μm thick in the place where there is not any dielectric layer.

Further, the thin-film at the opening P2 is also anodic oxidized to form the anodic oxide layer 6b for the reason of making the TaN resistor layer 5b just under the anodic oxidize layer 6b be about 0.05 μm thick with a view to obtaining a desired resistance of 50 Ω/□ (per unit area) and to provide the Ta—ON anodic oxide layer 6b for thereby preventing oxidization of the resistor layer ($Ta_2N$) 5b and stabilizing the characteristic.

In this connection, since the surface of the lower electrode base layer 3 is flattened or smoothed by the effect of the levelling characteristic of plating, the thin-film 4 can never be nonuniform in thickness. Accordingly, the dielectric layer 6a can never be nonuniform in thickness and thus can obtain a high dielectric breakdown voltage.

Figure 5:
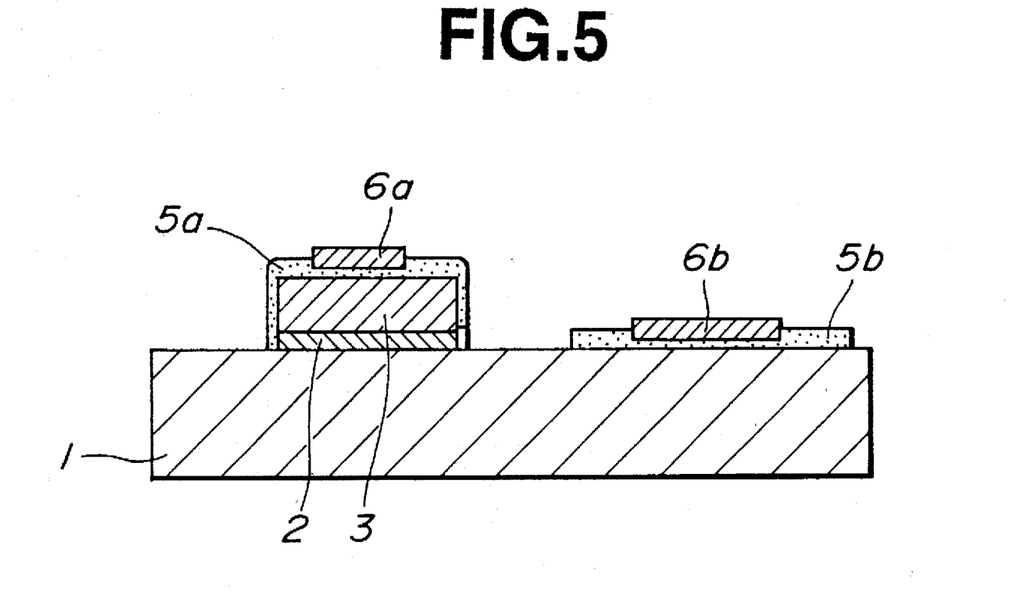
FIG. 5 is a sectional view similar to FIG. 4 but illustrates a further step of removing the photoresists R1 from the ceramic substrate 1.

Thereafter, as shown in FIG. 5, the resist R1 is removed, and the unnecessary part of the thin-film 4 is removed by etching.

Figure 6:
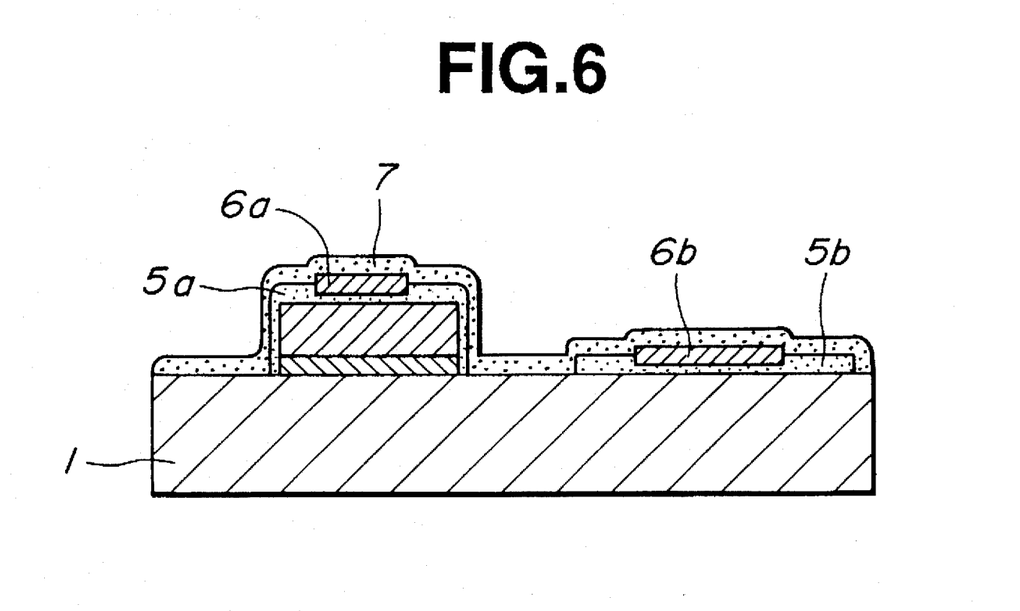
FIG. 6 is a view similar to FIG. 5 but illustrates a further step of forming an upper electrode connecting layer 7 on the substrate.

Then, as shown in FIG. 6, on the entire surface, an upper electrode connecting layer 7 of Ti (0.2 μm) and Cu (0.5 μm) is formed by sputtering.

Figure 7:
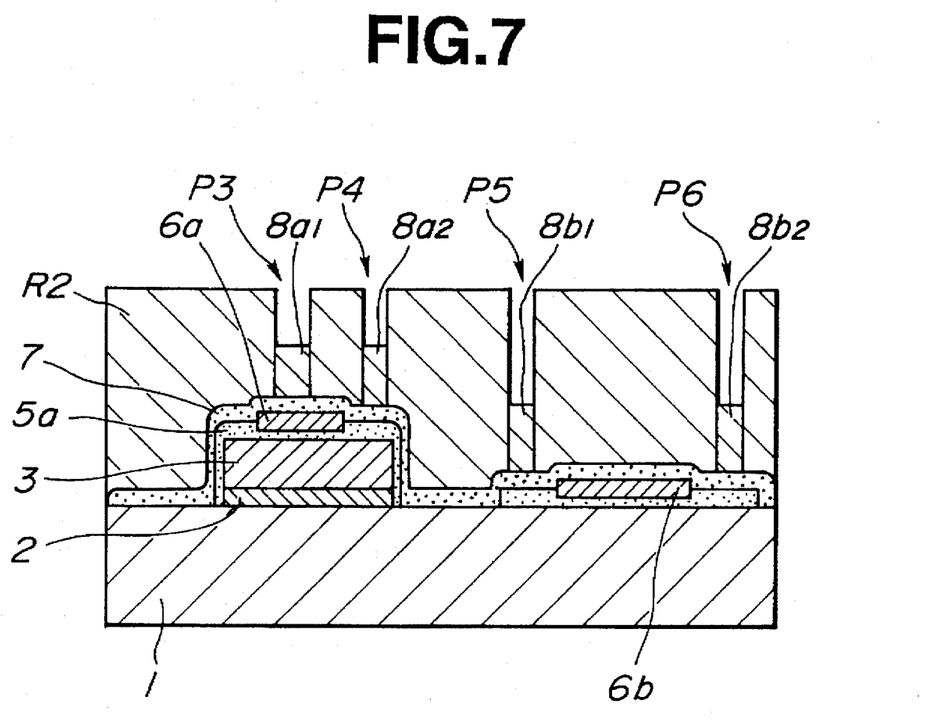
FIG. 7 is a view similar to FIG. 6 but illustrates a further step of forming photoresists R2 on the substrate, forming openings P3–P6 and forming an upper electrode layer 8a1, a lower electrode leading terminal 8a2, etc.

Thereupon, as shown in FIG. 7, a photoresist R2 is applied and a predetermined pattern is exposed to form openings P3 and P4 above the dielectric layer 6a and the lower electrode layer 5a for thereby forming by electroplating a 0.5×0.5 mm upper electrode layer 8a1 and a 0.3×0.3 mm lower electrode leading terminal 8a2 which are both made of Cu (2 μm thick), Ni (2 μm thick) and Au (1 μm thick). Further, in a similar manner, openings P5 and P6 are formed on the resistor layer 5b and similar resistor terminals 8b1 and 8b2 are formed.

Figure 8:
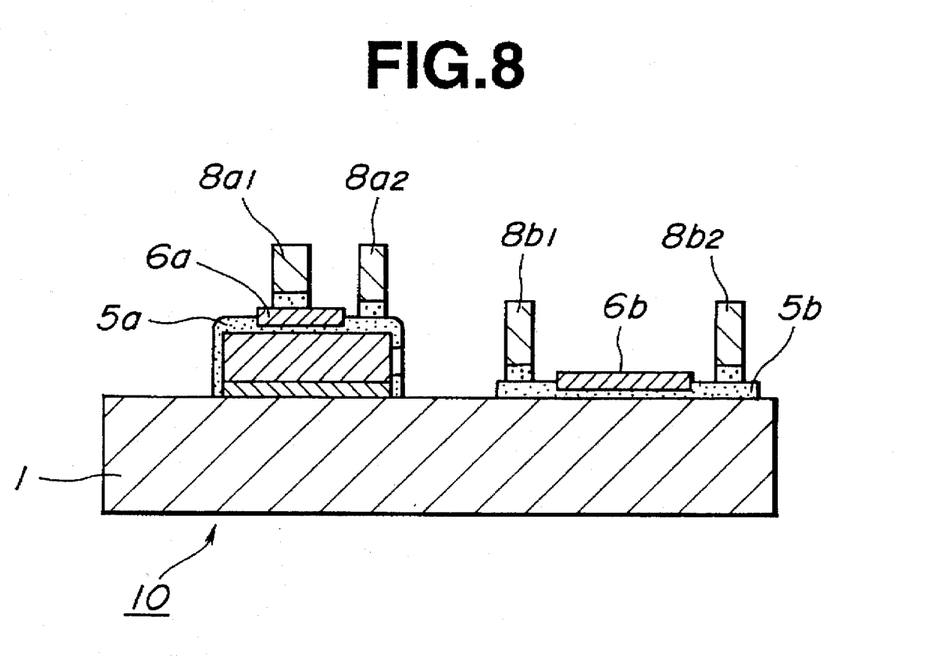
FIG. 8 is a view similar to FIG. 7 but illustrates a further step of removing the photoresists R2 from the substrate and completing a ceramic substrate with a thin-film capacitor according to an embodiment of the present invention.

Thereafter, the resist R2 is removed and the unnecessary portion of the upper electrode connecting layer 7 is removed by etching, whereby a ceramic substrate 10 with a thin-film capacitor, having a capacitor and a resistor as shown in FIG. 8, is completed. The left-hand side in FIG. 8 is the portion for constituting the capacitor and the right-hand side is for constituting the resistor. The $Ta_2N$ portion formed by sputtering is used as the lower electrode layer 5a in the capacitor section and as the resistor layer 5b in the resistor section.

In this connection, while the lower electrode layer 5a is about 0.15 μm thick at a portion having no other layer thereabove and thus has a resistance of about 15 Ω/□ (per unit area), it is so thin, i.e., about 0.05 μm at a portion having the dielectric layer 6a, i.e., Ta—ON thereabove and thus has a resistance equal to that of the resistor layer 5b, i.e., about 50 Ω/□ (per unit area).

However, under the lower electrode layer 5a, the lower electrode base layer 3 made of Cu—Ni plating and having the resistance of about $2\times10^{-3}$ Ω/□ (per unit area) is provided. Accordingly, the total resistance of the lower electrode layer 5a and the lower electrode base layer 3 is determined by the resistance of the lower electrode base layer 3 and thus becomes sufficiently low, i.e., $2\times10^{-3}$ Ω/□ (per unit area), so there is not caused any problem by using Ta$_2$N for the lower electrode layer 5a.

That is, the capacitor of this embodiment is sufficiently low in the actual resistance of the lower electrode base layer and thus has an excellent high frequency characteristic.

Figure 9A:
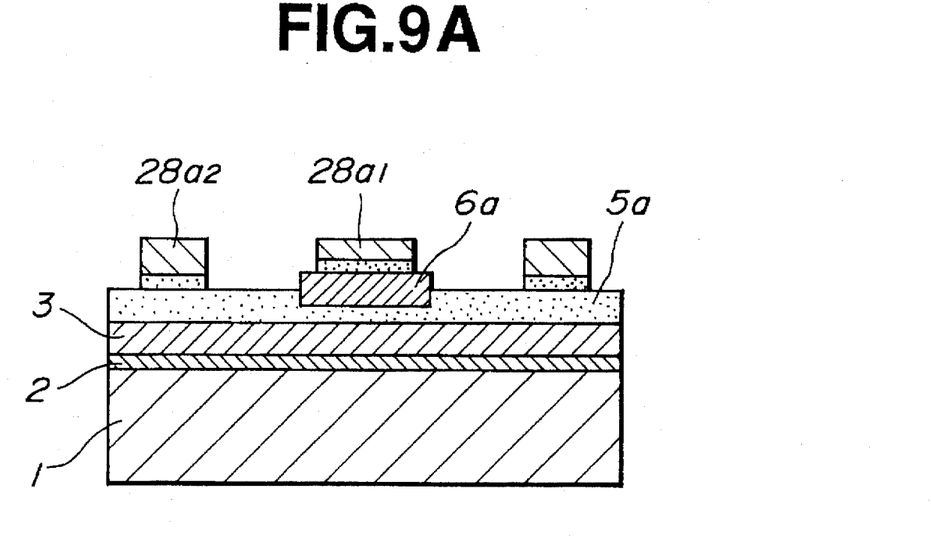
FIG. 9A is a sectional view of a capacitor used for measurement of loss factor.
Figure 9B:
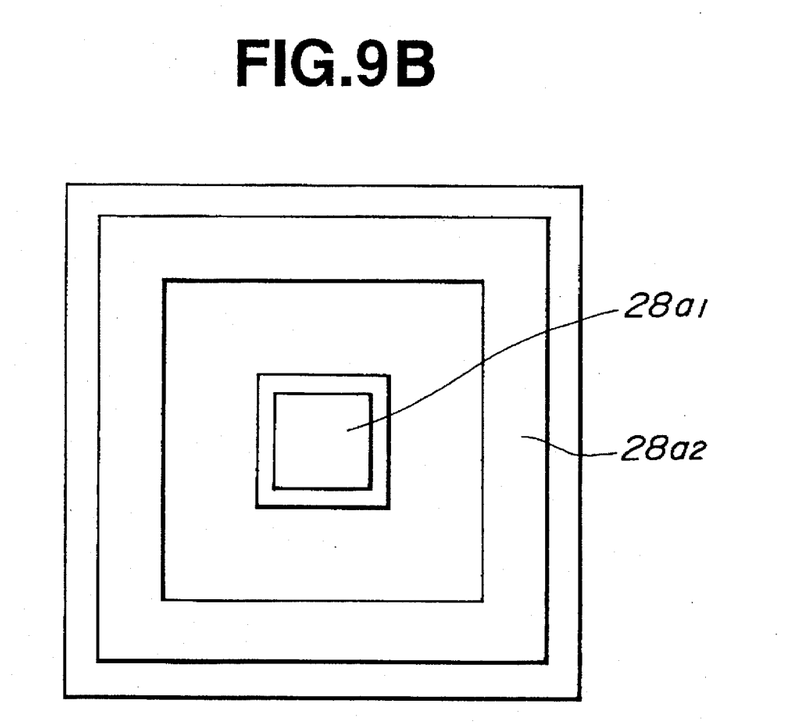
FIG. 9B is a plan view of the capacitor of FIG. 9A.

In order to recognize such an effect, a capacitor 20 as shown in FIG. 9 was formed in the manner described as above and used as a test example. In this example, for ease of measurement, the upper electrode layer 28a1 of the capacitor for connection to a probe was sized to be 5×5 mm and the lower electrode leading terminal 28a2 for connection to another probe was formed into a hollow, rectangular shape so as to surround the upper electrode layer 28a1 with an interval of 0.2 mm therebetween.

In the meantime, a comparative example 1 having a similar shape and formed with Ta$_2$N directly on the substrate without being formed with a lower electrode base layer whilst being treated by an anodic forming process and formed with a 0.15 μm thick Ta$_2$N lower electrode layer and a 0.3–0.5 μm thick Ta—ON dielectric layer and a comparative example 2 formed with a 0.5 μm thick Ta lower electrode layer and a 0.3–0.5 μm thick Ta$_2$O$_5$ dielectric layer were prepared.

A probe was put on the electrode layer 28a1 and terminal 28a2 of each of the above described examples of this invention and comparative examples 1 and 2 to measure the frequency dependent characteristic of the loss factor (tan δ) possessed by the capacitor by means of an impedance analyzer (HP-4194A). The result of measurement is shown in Table 1 and FIG. 10.

TABLE 1

| LOWER ELECTRODE LAYER & LOWER ELECTRODE BASE LAYER | | FREQUENCY (MHz) | | | | |
|---|---|---|---|---|---|---|
| | | 0.1 | 1.0 | 10 | 20 | 100 |
| | | LOSS FACTOR (%) | | | | |
| EXAMPLE OF THIS INVENTION | Cu (10 μm)-Ni (1 μm)-Ta$_2$N (0.15 μm) | 0.20 | 0.20 | 0.20 | 0.20 | 0.20 |
| COMPARATIVE EXAMPLE 1 | Ta$_2$N (0.15 μm) | 0.20 | 0.25 | 0.72 | 1.30 | 6.50 |
| COMPARATIVE EXAMPLE 2 | Ta (0.5 μm) | 0.20 | 0.20 | 0.32 | 0.45 | 1.30 |

Figure 10:
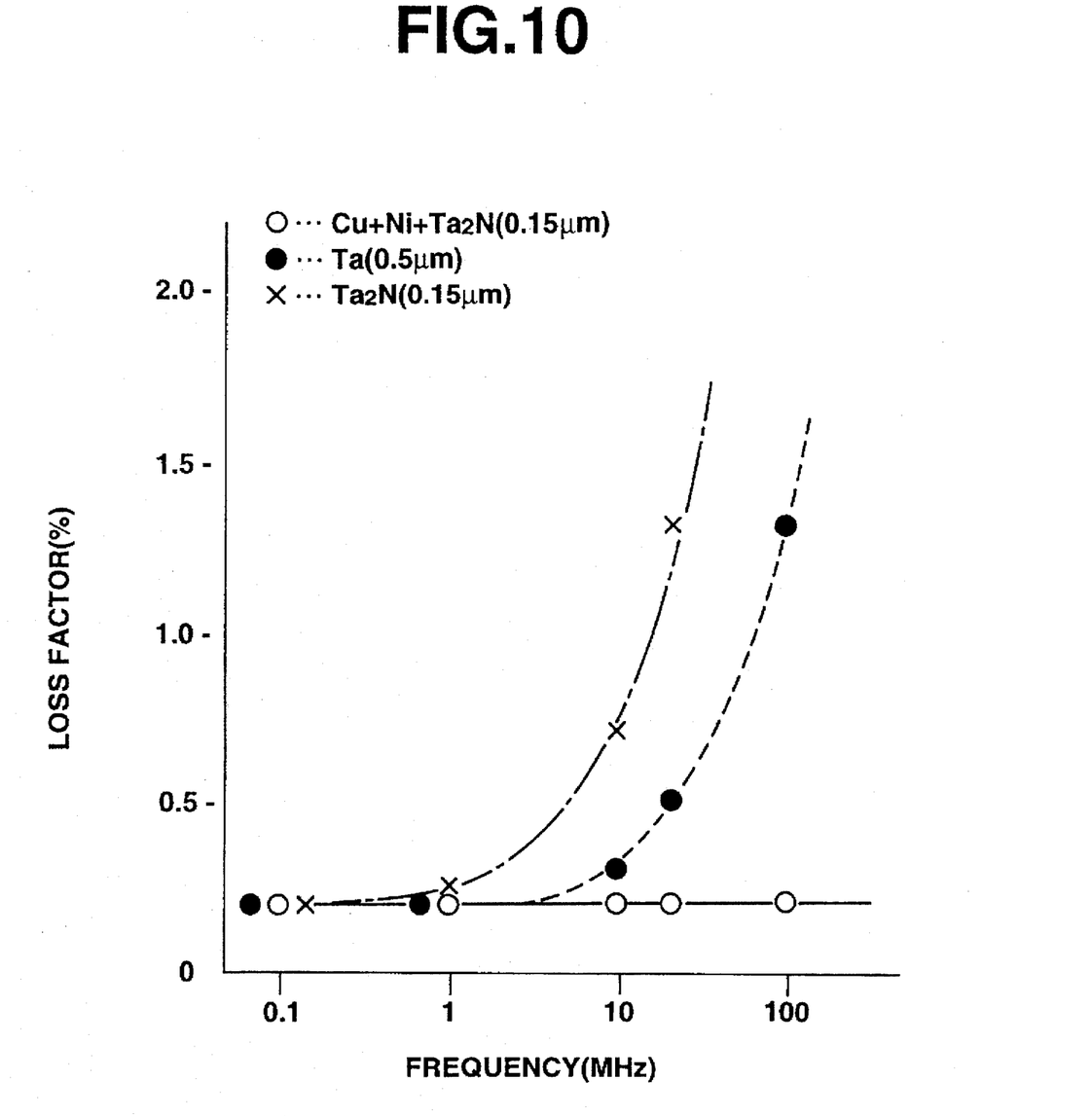
FIG. 10 is a graph for depicting a variation of the loss factor (tan δ) of examples of this invention and comparative examples depending upon a variation of frequency.

As will be understood from Table 1 and FIG. 10, the example of this invention has a loss factor (tan δ) which is low and constant in a frequency range from low to high and thus can exhibit a good frequency dependent characteristic. This is because the resistance of the lower electrode of the capacitor is actually held low by the existence of the Cu and Ni layer.

On the other hand, the comparative examples 1 and 2 have tan δ that increases as the frequency increases. This is because the resistance of the lower electrode layer is high. In the meantime, the comparative example 1 has a larger loss factor than the comparative example 2 because Ta$_2$N having a high resistance is used for its lower electrode layer.

In the meantime, Cu is used for forming part of the lower electrode base layer 3 in this embodiment with a view to holding low the resistance of the lower electrode base layer and thereby making lower the actual resistance of the lower electrode layer. On the other hand, Ni is used with a view to lowering the resistance as well as to mitigating the thermal stress caused between Cu and Ta$_2$N since Cu and Ta$_2$N of the lower electrode layer largely differ in thermal expansion coefficient from each other and the thermal expansion coefficient of Ni is relatively low and approximate to that of Ta$_2$N. Further, Ni, which is hard to oxide, is used for covering the surface of Cu which is readily oxidized with a view to maintaining the conductivity and the low resistance of the lower electrode base layer. However, depending on the size (area) of the dielectric layer and the oxidation preventing treatment of same, only Cu can suffice in some case, and in the case where a slight increase of resistance is permitted only Ni can be used. Further, other than Cu and Ni, a precious metal such as Au, Ag, Pt, Pd, etc. may be used for forming the lower electrode layer. Those metals, though expensive, are hard to oxidize and have an advantage of dispensing with Ni plating. Further, a metal such as Fe, etc. can be used.

Further, while the plating was carried out by using an electroplating process and by previously forming the connecting layer 2 on the substrate 1, it will do to treat the surface of the ceramic substrate by a process for activation and thereafter form a plating layer by an electroless plating process.

While in the above described embodiment the thin-film is formed from Ta$_2$N by sputtering, it may otherwise be formed from Ta, Ti, Al, or the like.

In this instance, Ta$_2$O$_5$, TiO$_3$, Al$_2$O$_3$ or the like is used as a dielectric. Among them, Ta$_2$O$_5$ is particularly suitable since it has a relatively high dielectric constant.

However, in the case where the above described metals are used as a thin-film, the thin-film cannot be used as a resistor as in the above described embodiment.

Further, while in the above described embodiment an anode forming process is used as a method of oxidizing a part of the thin-film and forming it into a dielectric layer, a method other than that may be used for oxidizing a part of the thin-film. For example, such a method may be employed that after a thin-film is formed, a part of the thin-film is oxidized by heating in an oxidizing atmosphere.

Further, while in the above described embodiment the thin-film of Ta$_2$N is formed by sputtering, it will be apparent that a similar effect can by obtained by using another thin-film forming technique such as vapor deposition, ion plating, etc.

From the foregoing, it will be understood that according to the present invention a lower electrode base layer formed by plating is provided as a basis for a lower electrode layer, so the resistance of an electrode for a capacitor can be lowered.

It will be further understood that according to the present invention it becomes possible to provide a ceramic substrate with a thin-film capacitor which has an excellent high frequency characteristic.

It will be further understood that according to the present invention a ceramic substrate, which is not glazed and therefore inexpensive, can be used, so it becomes possible to provide a ceramic substrate with a thin-film capacitor, which is inexpensive and reliable by the effect of the levelling characteristic of the plating and which can be produced with a high yield rate.

What is claimed is:

1. A ceramic substrate with a thin-film capacitor, comprising:
   a ceramic substrate;
   a lower electrode base layer which is a metallic electroplating or electroless plating layer, formed on said ceramic substrate;
   a lower electrode layer formed on said lower electrode base layer;
   a dielectric layer formed on said lower electrode layer and made of an oxide of a material constituting said lower electrode layer; and
   an upper electrode layer formed on said dielectric layer.

2. A ceramic substrate with a thin-film capacitor according to claim 1, wherein said lower electrode base layer is made of a material consisting essentially of copper.

3. A ceramic substrate with a thin-film capacitor according to claim 1, wherein said lower electrode base layer is made of a material consisting essentially of nickel.

4. A ceramic substrate with a thin-film capacitor according to claim 1, wherein said lower electrode base layer includes a layer section made of a material consisting essentially of copper and a layer section made of a material consisting essentially of nickel.

5. A ceramic substrate with a thin-film capacitor according to claim 1, wherein said lower electrode layer is made of one or more of metals selected from the group consisting of tantalum, titanium and aluminum.

6. A ceramic substrate with a thin-film capacitor according to claim 1, wherein said lower electrode layer is made of tantalum nitride and said dielectric layer is made of tantalum oxynitride.

7. A ceramic substrate with a thin-film capacitor according to claim 1, wherein the lower electrode base layer is made of a material comprising nickel and one or more of cobalt, phosphorus, and boron.

8. A ceramic substrate with a thin-film capacitor according to claim 1, wherein the lower electrode base layer comprises a surface smoothing agent.

9. A ceramic substrate with a thin-film capacitor according to claim 1, wherein the lower electrode base layer has a thickness of at least 1 μm.

10. A ceramic substrate with a thin-film capacitor according to claim 1, further comprising one or more of a connecting layer between the dielectric layer and the upper electrode layer or a connecting layer between the ceramic substrate and the lower electrode base layer.

11. A ceramic substrate with a thin-film capacitor according to claim 1, further comprising a resistor.

12. A ceramic substrate with a thin-film capacitor according to claim 1, wherein the lower electrode base layer is plated by an electroplating process.

13. A ceramic substrate with a thin-film capacitor according to claim 1, wherein the lower electrode base layer is plated by an electroless plating process.

14. A ceramic substrate with a thin-film capacitor according to claim 1, wherein the ceramic substrate is unglazed.

15. A method of producing a ceramic substrate with a thin-film capacitor, comprising the steps of:
   forming by metallic electroplating or electroless plating a lower electrode base layer on a ceramic substrate;
   forming a thin-film on said lower electrode base layer;
   processing a surface portion of said thin-film by an oxidizing process to form a dielectric layer whilst allowing a remaining portion of said thin-film to be formed into a lower electrode layer; and
   forming an upper electrode layer on said dielectric layer.

16. A method of producing a ceramic substrate with a thin-film capacitor according to claim 15, wherein said metallic plating is copper plating.

17. A method of producing a ceramic substrate with a thin-film capacitor according to claim 15, wherein said metallic plating is nickel plating.

18. A method of producing a ceramic substrate with a thin-film capacitor according to claim 15, wherein said metallic plating includes copper plating, and nickel plating performed thereafter.

19. A method of producing a ceramic substrate with a thin-film capacitor according to claim 15, wherein said oxidizing process is an anode forming process.

20. A ceramic substrate with a thin-film capacitor comprising:
   a ceramic substrate;
   a lower electrode base layer which is a metallic electroplating or electroless plating layer, formed on said ceramic substrate;
   a lower electrode layer formed on said lower electrode base layer;
   said lower electrode layer having an oxidized surface section constituting a dielectric layer; and
   an upper electrode layer formed on said dielectric layer.

* * * * *